United States Patent [19]

Nakazawa et al.

[11] 4,103,998
[45] Aug. 1, 1978

[54] AUTOMATIC ALIGNMENT APPARATUS

[75] Inventors: Kiwao Nakazawa, Tokyo; Akikazu Tanimoto, Kawasaki, both of Japan

[73] Assignee: Nippon Kogaku K.K., Tokyo, Japan

[21] Appl. No.: 706,292

[22] Filed: Jul. 19, 1976

[30] Foreign Application Priority Data

Jul. 21, 1975 [JP] Japan .................................. 50-88398

[51] Int. Cl.$^2$ ............................................. G01B 11/26
[52] U.S. Cl. ............................... 356/152; 250/237 G; 250/571; 356/169; 356/172
[58] Field of Search ........................ 356/152, 169, 172; 318/640; 250/201, 571, 237 R, 237 G

[56] References Cited

U.S. PATENT DOCUMENTS

| 3,796,497 | 3/1974 | Mathisen et al. | 356/152 |
| 3,861,798 | 1/1975 | Kobayashi et al. | 356/172 X |
| 3,865,483 | 2/1975 | Wojcik | 356/169 |
| 3,867,038 | 2/1975 | Westell | 356/169 |
| 3,943,359 | 3/1976 | Matsumoto et al. | 250/201 |
| 3,989,385 | 11/1976 | Dill et al. | 356/152 |

*Primary Examiner*—S. C. Buczinski
*Attorney, Agent, or Firm*—Fitzpatrick, Cella, Harper & Scinto

[57] ABSTRACT

An automatic alignment apparatus comprises reference marks formed at the right-hand and left-hand sides of each of a semiconductor wafer and a mask, each of the reference marks comprising two mark elements extending in two different directions. These reference marks are formed such that when the mask and wafer are overlapped with each other, diffracted lights in different directions are produced from adjacent ones of the mark elements on the mask and wafer. A first and a second source of coherent light are provided for illuminating the right-hand and the left-hand marks, respectively, on the mask and wafer with a coherent spot light. First and second scanning means are provided for scanning the right-hand and the left-hand marks, respectively, on the mask and wafer by the spot light so that the diffracted lights are produced from the mark elements of the wafer and mask in one stroke of scanning. First to fourth detector means are used for respectively detecting the diffracted lights in one direction and the diffracted lights in the other direction produced from the right-hand marks on the wafer and mask and the diffracted lights in one direction and the diffracted lights in the other direction produced from the left-hand marks on the wafer and mask and for photoelectrically converting the diffracted lights respectively. Wafer and mask position signals for the alignment of the wafer and mask may be separately produced by the first to fourth detector means.

11 Claims, 25 Drawing Figures

<u>PRIOR ART</u>

FIG. 4-a
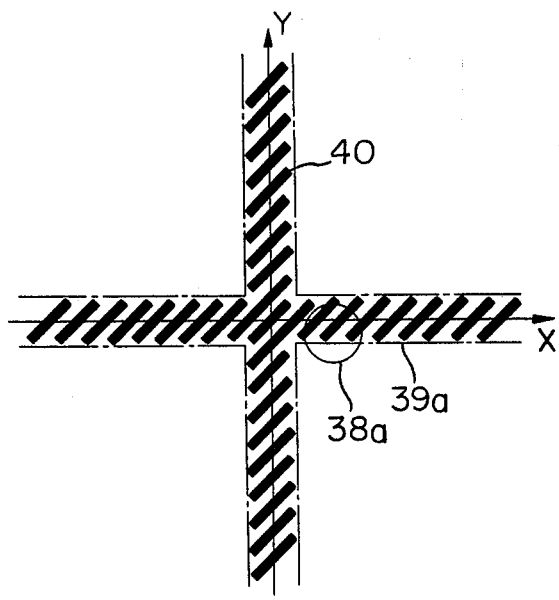
FIG. 4-b
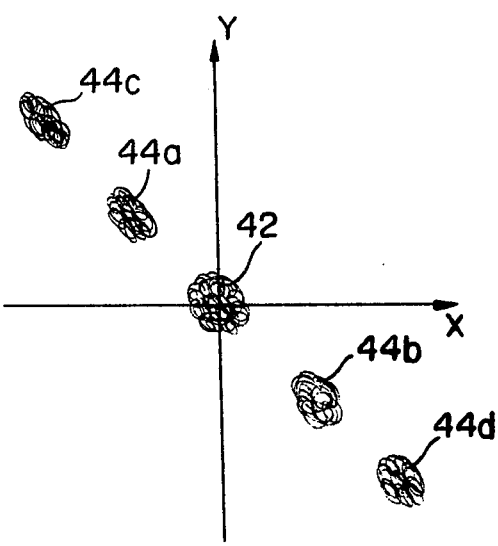
FIG. 4-c
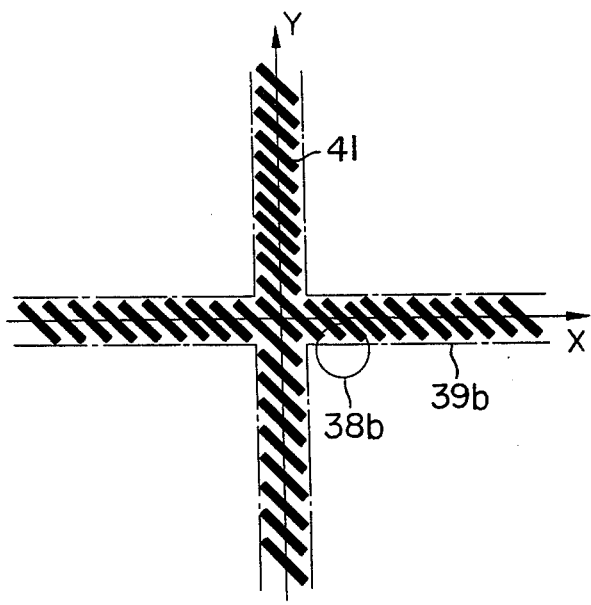
FIG. 4-d
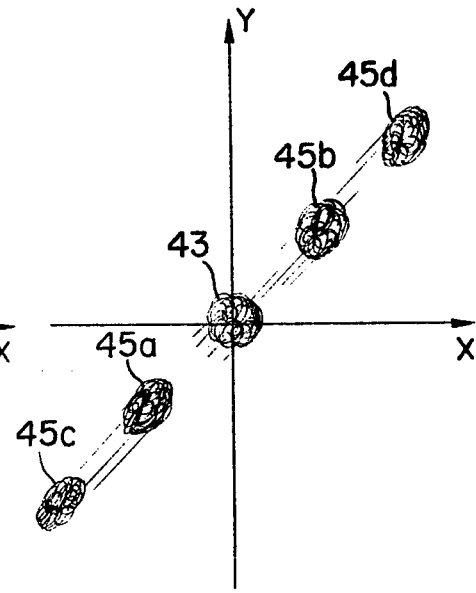

FIG. 5-a
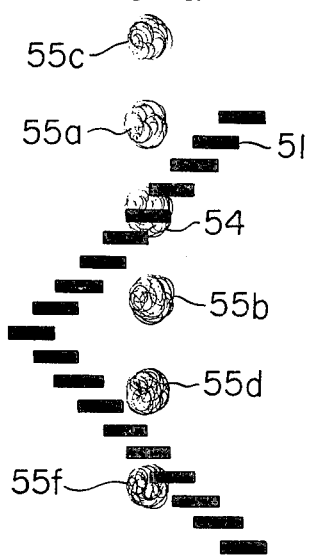
FIG. 5-b
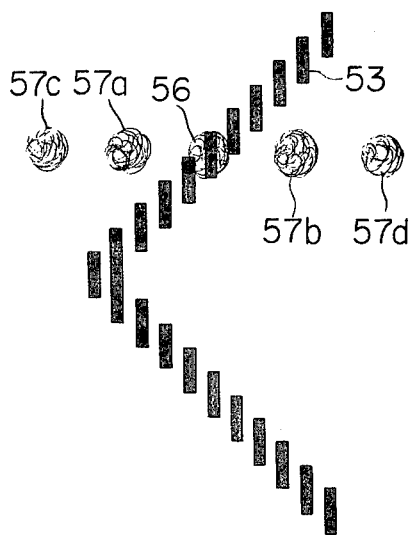
FIG. 5-c
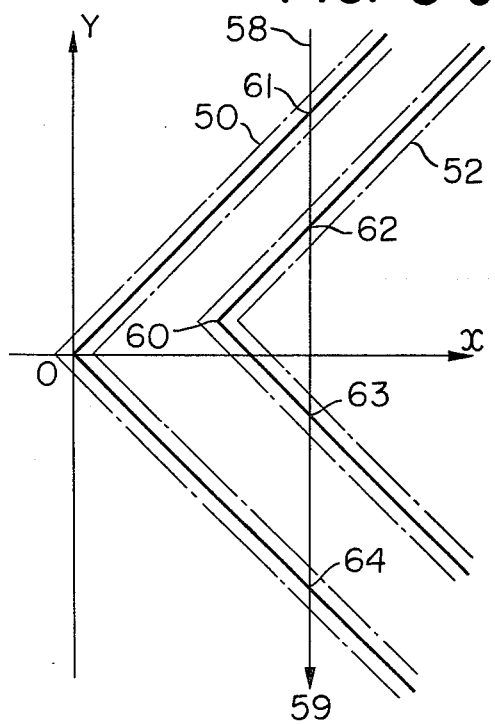
FIG. 5-d
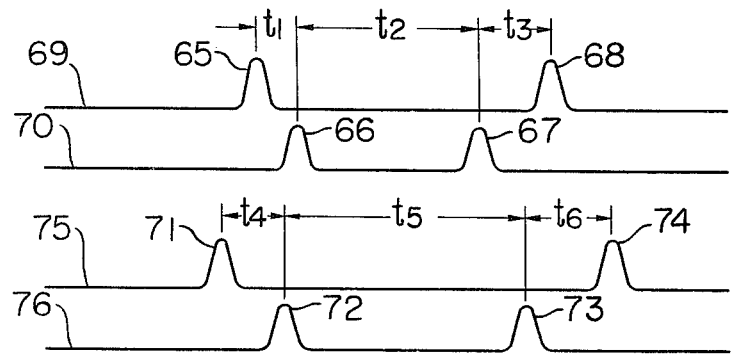

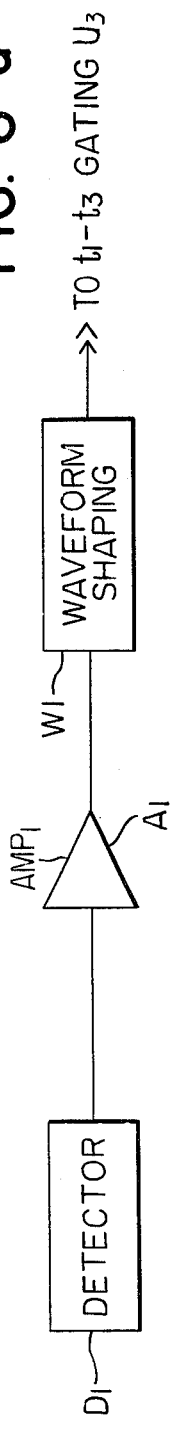
FIG. 6-a
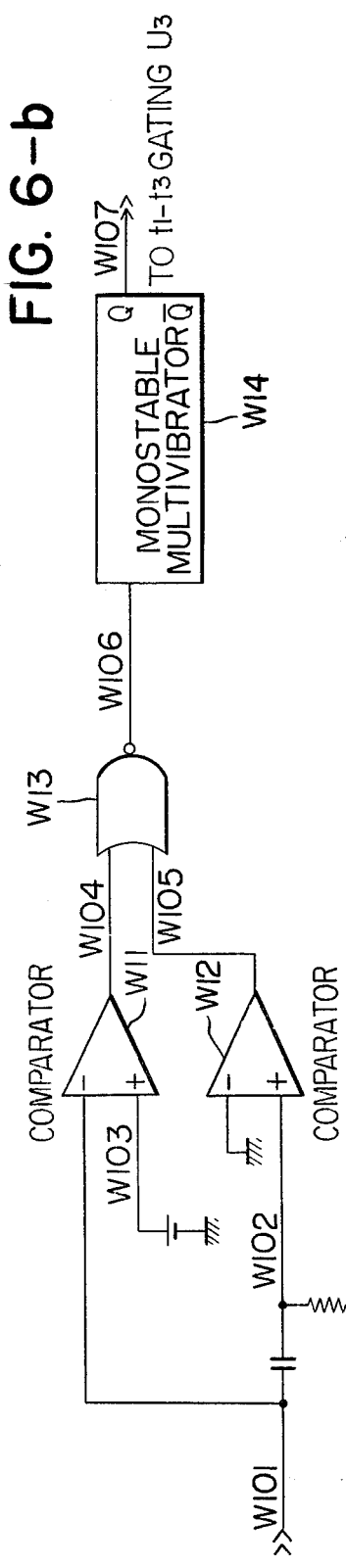
FIG. 6-b
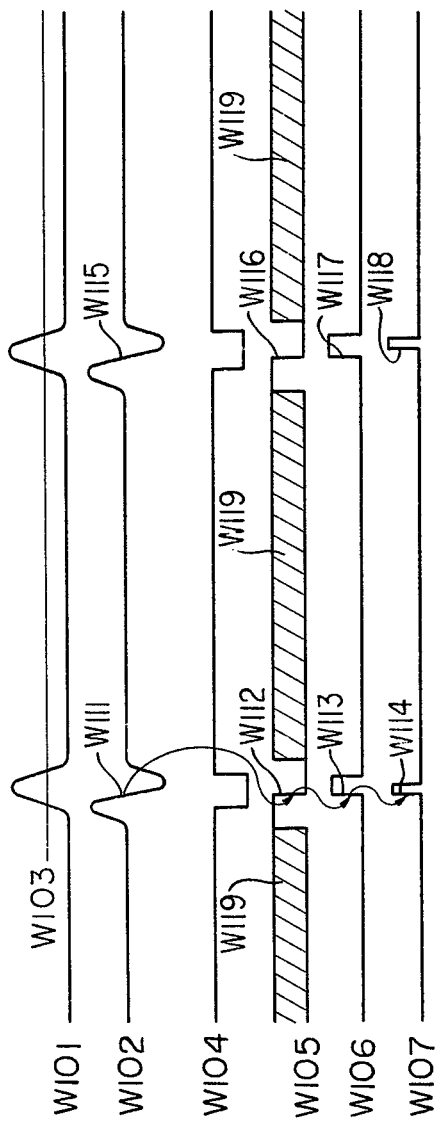
FIG. 6-c

FIG. 8
C1
C2
C3
X1 up GX1
X2 up GX3
X up GX5
FIG. 12
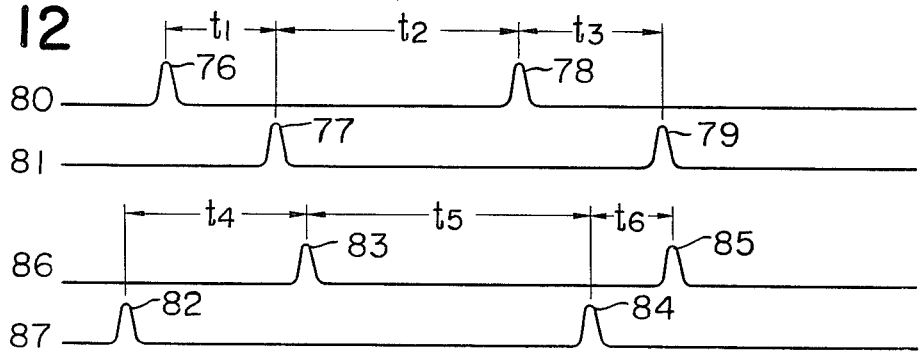
FIG. 14
C4
C5
C6
C7
C8
GX1'
GX2'
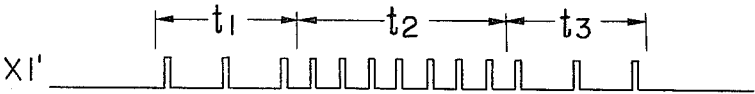
GY1', Gθ1'
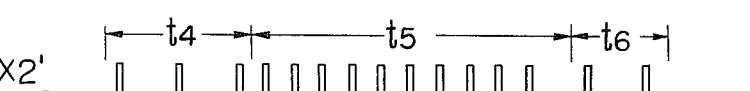
GY2', Gθ2'
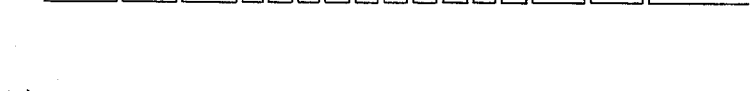
GY3', Gθ4'
GY4', Gθ3'

FIG. 11-a
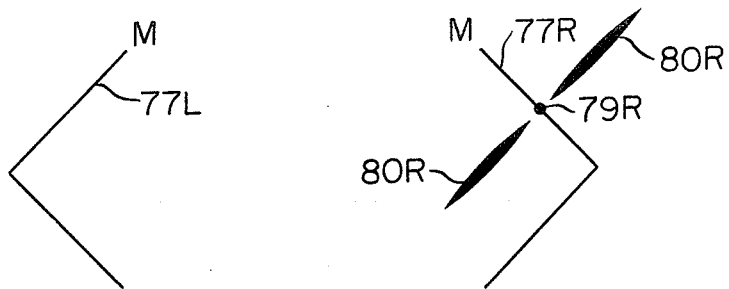
FIG. 11-b
FIG. 11-c
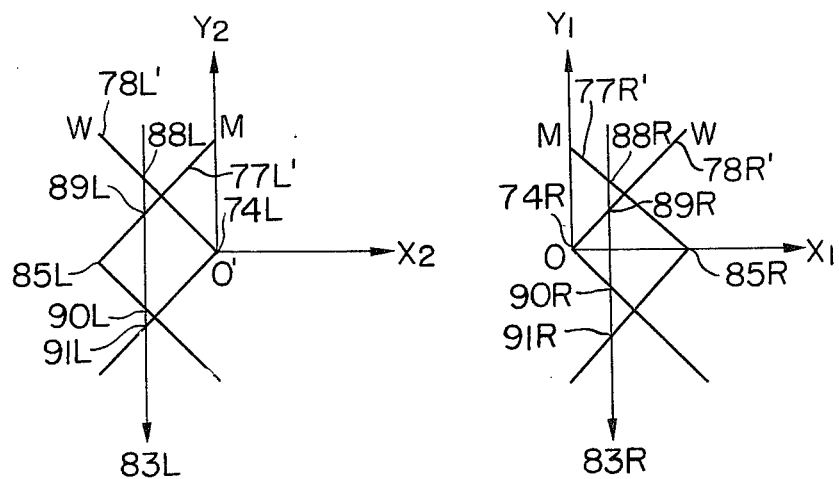

AUTOMATIC ALIGNMENT APPARATUS

BACKGROUND OF THE INVENTION

1. Field of the Invention

This invention relates to an apparatus for automatically aligning two different objects with each other. More specifically, it relates to an apparatus which employs a source of coherent light as the light source for alignment and in which predetermined reference marks are formed on two different objects and when the two objects are to be mutually aligned, diffracted lights from the alignment marks on the objects illuminated by the coherent light are caught as the optical position signals of the alignment marks and further, the optical position signals from the alignment marks on the two different objects are detected entirely independently so that the objects are displaced in response to the optical position signals, thereby accomplishing automatic mutual alignment of the objects.

2. Description of the Prior Art

Applications of the apparatus for automatically aligning two different objects with each other have been considered in many fields. Especially, in the process of forming an integrated circuit pattern on a semiconductor wafer by using more than two different photomasks in a semiconductor printing apparatus, an important task for enhancing the efficiency and accuracy of the alignment work is to automatically align the photomasks and the circuit pattern on the semiconductor wafer in a predetermined relationship prior to the printing.

Therefore, the present invention will hereinafter be described by taking as an example the automatic alignment apparatus in the semiconductor printing machine, whereas the invention is not restricted thereto but is applicable in a wider field wherein alignment is required.

The conventional automatic alignment apparatus in the semiconductor printing machine will be described with respect to one which employs a photoelectric microscope as shown in FIG. 1 of the accompanying drawings.

Designated by 1 is a photomask and denoted by 2 is a semiconductor water coated with a sensitive agent such as photoresist.

By an image forming lens 3, the image of an alignment mark formed on the semiconductor wafer 2 is formed on a vibratory slit 5, and the light beam passed through the vibratory slit 5 is converted into an electrical signal by a photoelectric converter element 6. A signal from an oscillator 7 for driving the vibratory slit 5 is applied as a reference signal to a synchronism detector 8. The signal applied from the photoelectric converter element 6 to the synchronism detector is synchronism-detected and thence passed through a power amplifier 9 to drive a servomoter 10 which controls a deflector 4.

Now, if the image of the alignment mark on the semiconductor wafer 2 does not lie at the center of vibration of the vibratory slit 5, the output of the synchronism detector 8 will be a DC signal corresponding to the positional deviation of the alignment mark on the semiconductor wafer. In accordance with this DC signal, the servomotor 10 drives the deflector 4, whereby the beam of image light from the alignment mark on the semiconductor wafer 2 is deflected so as to effect automatic control such that the image of the alignment mark on the semiconductor wafer 2 lies at the center of vibration of the vibratory slit 5. Thus, positioning of the semiconductor wafer 2 is effected. In order that such operation may be accomplished, the alignment mark on the photomask 1 must be at a position offset from the view field of the image forming lens 3. This is because if the alignment mark on the photomask 1 should lie within the view field of the image forming lens 3, this alignment mark cannot be discriminated from the alignment mark on the semiconductor wafer 2.

When the positioning of the semiconductor wafer 2 has been completed, the deflector 4 is fixed intactly, and then positioning of the photomask 1 is carried out in the same manner as described with respect to the semiconductor wafer 2. More specifically, the photomask 1 is displaced in a predetermined direction by a servomotor 11 so that the alignment mark on the photomask comes into the view field of the image forming lens 3. The image of the alignment mark on the photomask 1 is formed on the vibratory slit 5 and if this image is deviated from the center of vibration of the slit, an error signal is produced by the synchronism detector 8 to drive the servomotor 11, whereby the positioning of the photomask 1 is accomplished.

Such a positioning method using a photoelectric microscope has the following two disadvantages:

(A) If positioning of the photomask 1 is effected after the positioning of the semiconductor wafer 2, the images of the alignment marks on the photomask and the semiconductor wafer overlap each other on the vibratory slit 5. Ultimately, the alignment between the images of these two alignment marks is effected by the positioning of a composite optical image comprising the images of the two alignment marks. If the composite optical image has an error with respect to the alignment between the semiconductor wafer and the photomask, such error will directly affect the accuracy of the positioning.

(B) There is a problem of contrast of the alignment mark images. Especially, the semiconductor wafer is subjected to several steps of necessary treatment during the manufacture of integrated circuit and under the influence of such treatment, the alignment mark on the semiconductor wafer may be greatly reduced in contrast as an optical image. Reduced contrast of the alignment mark affects the accuracy with which the position detection is effected by the photoelectric microscope.

These two disadvantages (A) and (B) would offer essential problems not only in the alignment apparatus using the photoelectric microscope but also in the alignment apparatus utilizing the optical images of the semiconductor wafer and the photomask.

SUMMARY OF THE INVENTION

It is a general object of the present invention to eliminate the above-noted disadvantages peculiar to the conventional automatic alignment apparatus in a semiconductor producing machine and to enable a higher degree of alignment to be achieved.

It is also an object of the present invention to enable the optical signal from an alignment pattern on a semiconductor wafer and the optical signal from an alignment pattern on a photomask to be detected entirely separately in a semiconductor producing machine by using a source of coherent light (laser or the like) as the light source for alignment, even if the alignment patterns on the semiconductor wafer and the photomask are overlapped with each other during the alignment between the semiconductor wafer and the photomask.

It is another object of the present invention to improve the S/N ratio of the optical signal from the alignment pattern on the semiconductor wafer by using a source of coherent light as the light source for alignment, as compared with the method heretofore used.

To achieve these objects, the alignment apparatus of the present invention comprises reference marks formed at the right-hand and left-hand sides of each of a wafer and a mask, each of the reference marks comprising two mark elements extending in two different directions. These reference marks are formed such that when the mask and wafer are overlapped with each other, diffracted lights in different directions are produced from adjacent ones of the mark elements on the mask and wafer. A first and a second source of coherent light are employed for illuminating the right-hand and the left-hand marks, respectively, on the mask and wafer with a coherent spot light. First and second scanning means are provided for scanning the right-hand and the left-hand marks, respectively, on the mask and wafer by the spot light so that diffracted lights are produced from the mark elements of the wafer and mask in one stroke of scanning. First to fourth detector means are used for respectively detecting the diffracted lights in one direction and the diffracted lights in the other direction produced from the right-hand marks on the wafer and mask and the diffracted lights in one direction and the diffracted lights in the other direction produced from the left-hand marks on the wafer and mask and for photoelectrically converting the diffracted lights respectively. Thus, wafer position signals and mask position signals for the alignment of the wafer and mask may be separately produced by the first to fourth detector means.

The above objects and other features of the present invention will become fully apparent from the following detailed description of the invention taken in conjunction with the accompanying drawings.

BRIEF DESCRIPTION OF THE DRAWINGS

FIGS. 4-a and 4-c illustrate the configurations of the alignment marks on the photomask and the semiconductor wafer and a laser beam spot in the first embodiment.

FIGS. 4-b and 4-d illustrate the directions in which the diffracted lights obtained in FIGS. 4-a and 4-c move respectively.

FIGS. 5-a and 5-b illustrate the configurations of the alignment marks on the photomask and the semiconductor wafer in a second embodiment of the present invention and the directions in which the diffracted lights move with respect to the laser beam.

FIG. 5-c illustrates the method of alignment when the alignment marks on the photomask and wafer have entered the view field at a time.

FIG. 5-d is an illustration of the photoelectric outputs obtained in the second embodiment.

FIG. 6-a is a circuit diagram of a portion of the signal processing system in the second embodiment.

FIG. 6-b is a diagram of the waveform shaping circuit used in FIG. 6-a.

FIG. 6-c is a time chart for the wave form shaping circuit.

FIG. 8 illustrates the clock pulses and the pulse count in the second embodiment.

FIGS. 11-a, 11-b, and 11-c illustrate the alignment marks on the photomask and semiconductor wafer in a third embodiment of the present invention and the directions in which the diffracted lights emerge when the laser beam spot has entered.

FIG. 12 illustrates the photoelectric output signals in the third embodiment.

FIG. 14 illustrates the clock pulses and pulse count in the third embodiment.

DESCRIPTION OF THE PREFERRED EMBODIMENTS

Description will hereinafter be made of a first embodiment of the apparatus in which the optical signal from an alignment pattern on a semiconductor wafer and the optical signal from an alignment pattern on a photomask are separately detected.

Figure 2:
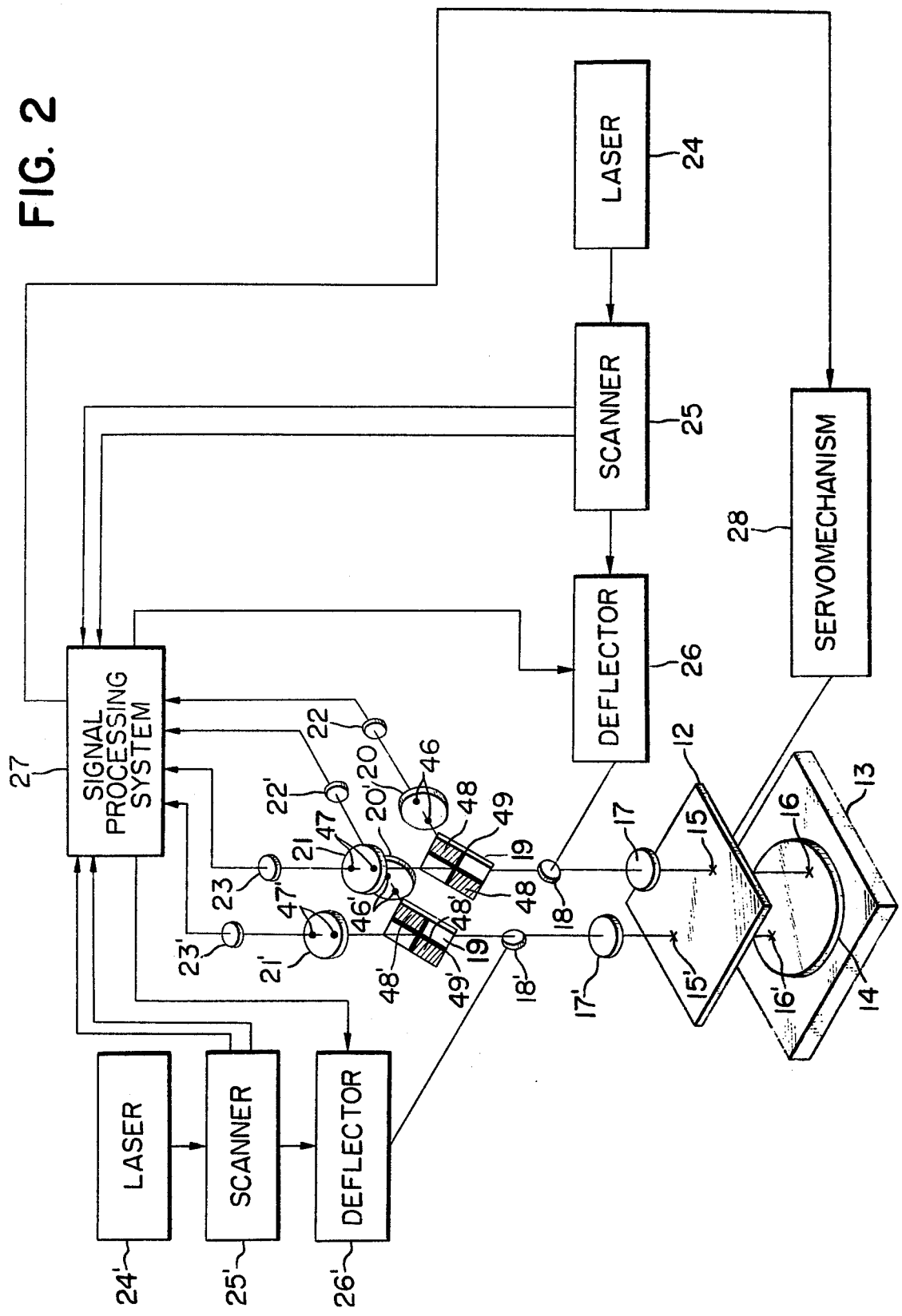
FIG. 2 is a schematic illustration of a first embodiment of the present invention.
Figure 3:
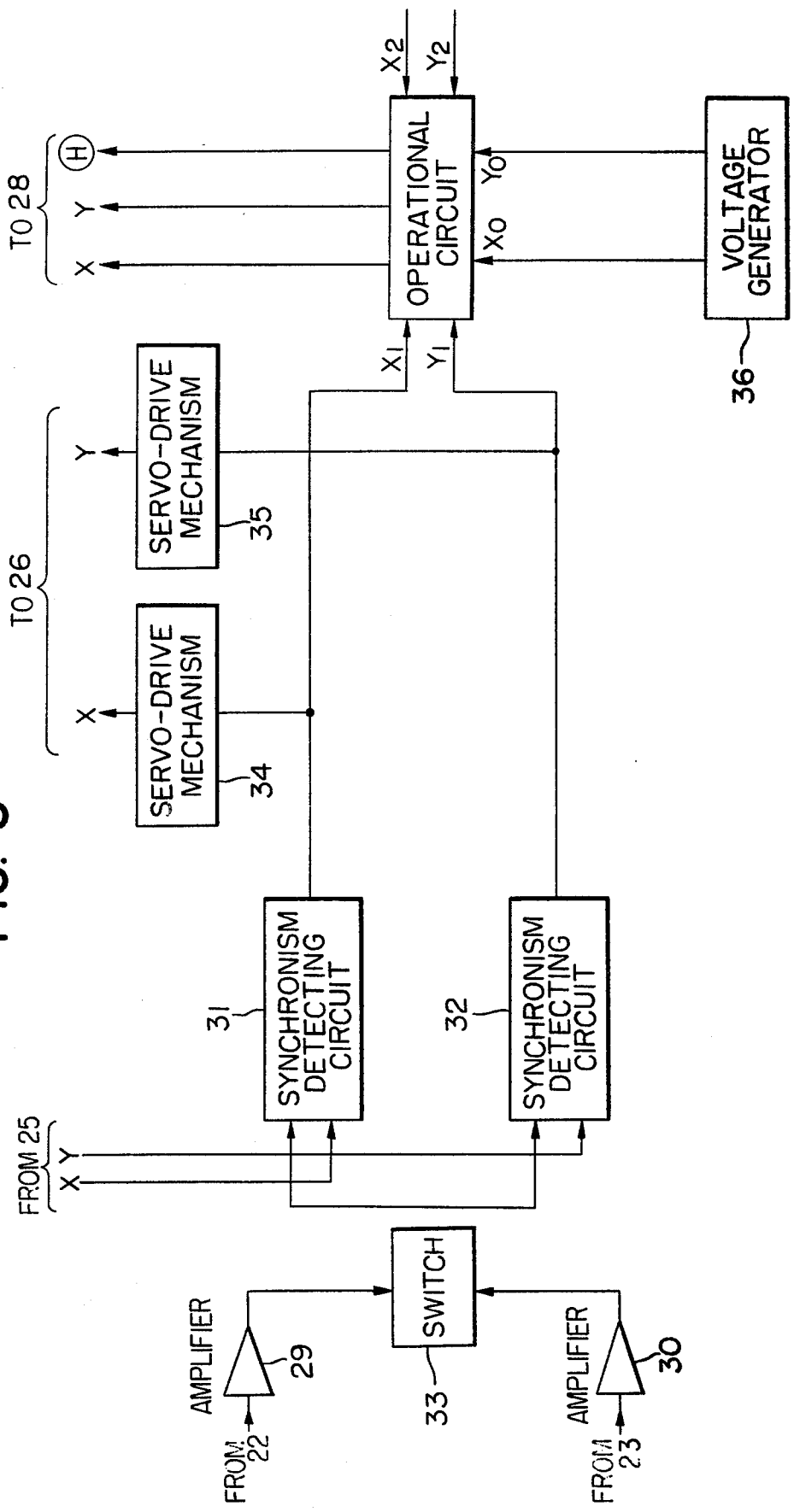
FIG. 3 is a block diagram of the signal processing system in the first embodiment.

FIG. 2 is a schematic illustration of the first embodiment and FIG. 3 is a block diagram of the signal processing system therein.

The optical system for scanning the right-hand alignment marks in FIG. 2 will first be explained. The beam from a laser 24 passes through a scanner 25 having two x- and y-axis. The scanner may be of the type in which a mirror, halbing glass or wedge-shaped glass is mechanically vibrated or pivoted, or may be an electro-optical element or an acousto-optical element. The laser beam is further passed through a deflector 26 having two x- and y-axes, and then focused on alignment marks 15 and 16 on a photomask 12 and wafer 14 by way of a mirror 18 and a lens 17. For the easier understanding, the mask 12 and the wafer 14 are shown with the spacing therebetween exaggerated. The alignment marks 15 and 16 used for the illustration of the present embodiment are cross-shaped as shown in FIGS. 4-a and 4-c. If both of the photomask 12 and the wafer 14 are automatically movable, the deflector may be eliminated. However, in the present embodiment wherein the wafer 14 is immovable, the deflector 26 is necessary to displace the scanning center of the laser beam spot to the center of the alignment mark 15 or 16 on the photomask 12 or the wafer 14. The deflector 26 changes its deflecting conditions from x-deflection to y-deflection at a slower speed than the scanner 25 vibrates the laser beam spot, and the deflecting conditions are controlled by servo-drive so that the center of vibration of the laser beam spot is aligned with the center of the alignment mark 16. Where the scanning in the x-axis direction and the scanning in the y-axis direction are effected at different frequencies, the scanning locus of the laser beam spot described on the alignment marks 15 and 16 is the Lissajou's figure.

The alignment marks formed on the photomask 12 and the wafer 14 are of cross shapes which respectively comprise rectangles 40 and 41 arrayed in different, for example, orthogonal directions as shown in FIGS. 4-a and 4-c and whose envelope forms lines extending in the x- and y-direction. The rectangles 40 or 41 forming a grating is, in the case of the photomask, provided by a thin film of metal evaporated on the surface of a glass substrate and in the case of the semiconductor wafer, provided by the concavo-convexity created by the surface of the semiconductor being subjected to the etching process. When the laser beam is incident on the grating 40 perpendicularly thereto so as to cover the grating, as indicated by a spot 38a, there takes place a phenomenon similar to that taking place in a diffraction grating. More specifically, diffracted light emerges in a direction inclined with respect to the normal to the surface of the grating by an angle $\theta$ which is determined by equation $a \sin \theta = n\lambda$, where $a$ is the grating constant, $\lambda$ the wavelength of the laser light and $n = 0, \pm 1, \pm 2$ and so on. When this is viewed from directly above the alignment mark 39a, various diffracted lights of degrees $0, +1, -1, +2, -2$ and so on appear in a plane spaced apart by a predetermined distance from the alignment mark 39a and in the direction perpendicular to the lengthwise direction of the grating 40, namely, at positions 42, 44a, 44b, 44c, 44d, etc. within a second and a fourth quadrant of the xy coordinates.

Likewise, in FIG. 4-c, when the laser light covers the grating 41 as indicated by a spot 38b, the diffracted lights from the alignment mark 39b appear at positions 43, 45a, 45b, 45c, 45d and so on within a first and a third quadrant of the xy coordinates shown in FIG. 4-d. Therefore, even when the alignment marks 39a and 39b of FIGS. 4-a and 4-c are overlapped with each other, the diffracted lights from the two alignment marks advance toward different zones (FIGS. 4-b and 4-d), so that the diffracted lights from the photomask and the semiconductor wafer can be separately detected by the use of two detectors.

In FIG. 2, let the focal length of the lens 17 be $f$ and assume that an alignment mark lies at the focusing point of the lens. Then, the center position of the diffracted light beam entering the lens 17 is spaced apart from the optical axis by $f \sin \theta = n\lambda f/a$. Then, the diffracted lights from the two alignment marks are separated by a kind of spatial filter such as a partial mirror 19 which comprises a glass plate divided vertically and horizontally into four sections of which the diagonally opposed sections 48 are formed as mirrors. The diffracted light of the 0 degree is returned in the direction of incidence of the laser beam by the small mirror 18 and does not enter the detecting system. Preferably, the cross lines 49 which divide the partial mirror 19 into four sections may be of great width and blackened, because, by doing so, the signals from the overlapped alignment marks 15 and 16 resulting from the expansion of the diffracted light will be prevented from mixing.

The light passed through the partial mirror 19 is condensed onto a detector 23 by a lens 21 while the light reflected by the partial mirror 19 is condensed onto a detector 22 by a lens 20, and these lights are photoelectrically converted by the respective detectors.

Now, assume that FIG. 4-a is the alignment mark 15 on the photomask and that FIG. 4-c is the alignment mark 16 on the wafer. Then, the detector 23 detects only the signal from the alignment mark 15 on the photomask and the detector 22 detects only the signal from the alignment mark 16 on the wafer.

Figure 1:
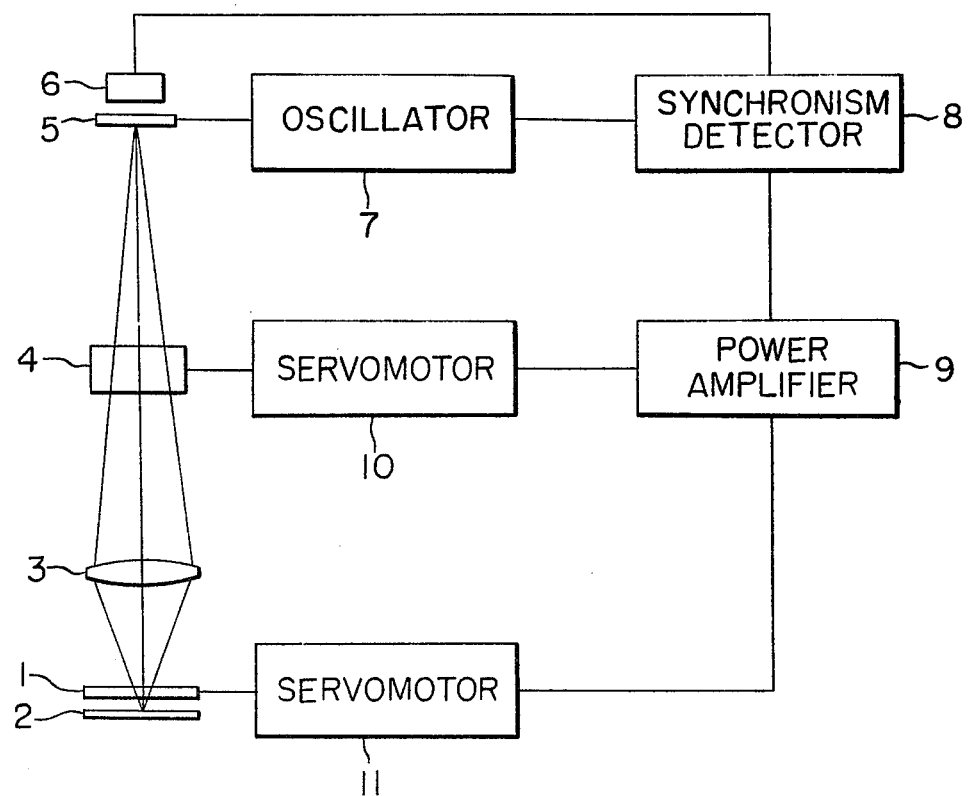
FIG. 1 schematically illustrates an automatic alignment apparatus according to the prior art.

The optical signals from the so detected alignment marks 15 and 16 on the photomask 12 and the semiconductor wafer 14 are derived from the diffracted lights, except those of 0 degree, from the two alignment marks and therefore, the gains of the optical signals obtained are determined by the diffraction efficiencies of the two alignment marks. Thus, with regard particularly to the alignment mark on the wafer, the optical contrast of this alignment mark has been a very important factor to the gain of the signal as already described with respect to the example of FIG. 1 which is the conventional method of catching the optical image of the alignment mark on the wafer to detect an optical signal, whereas the gain of the optical signal obtained as in the present embodiment is determined by the gain of the diffracted light provided by the slight concavo-convexity of the alignment mark on the wafer subjected to the etching process, and as compared with the conventional method, this may result in production of signals greater in gain independently of the optical contrast of the alignment mark.

The inspecting and detecting systems for alignment marks 15' and 16' on the left-hand side of FIG. 2 are similar to those for the right-hand alignment marks and need not be described, but those elements corresponding to those for the right-hand alignment marks are given similar reference numerals with prime.

The signal processing system 27 is shown in blocks in FIG. 3. Signals from the detectors 22 and 23 are amplified by amplifiers 29 and 30 and passed through a switch 33 to synchronism detecting circuits 31 and 32. The photoelectric signal from the detector 22 or 23 contains therein X-coordinate information and Y-coordinate information which have been modulated to different frequencies. These two frequencies are those for the X- and Y-scanning and determined to suitably different frequencies one of which is not even-number times the other, say, for example, 3 KHz for the X-scanning and 5 KHz for the Y-scanning. Synchronism signals for the X- and Y-scanning are being put out by the scanner 25, and the X-axis coordinate information is put out as a DC signal by the photoelectric signal being synchronism-detected by the circuit 31 with the aid of the synchronism signal for the X-scanning. The Y-axis coordinate information is likewise put out as a DC signal by the same photoelectric signal being synchronism-detected by the circuit 32 with the aid of the synchronism signal for the Y-scanning.

The synchronism detection for the axis X or Y is effected in the same manner as the synchronism detection in the conventional photoelectric microscopic system already described, and it is a method of accurately detecting the center of line as is well-known. In the synchronism detection, the signal of different frequency from the synchronism frequency is put out as zero volt and thus, the X and Y signals can be separately detected in the present invention. The synchronism detection outputs are applied to servo-drive mechanisms 34, 35 and operational circuit 37.

The sequence of alignment starts with placing and fixing the wafer 14 on a wafer fixing bed 13 in FIG. 2. At this stage, the alignment marks 16 and 16' on the wafer are barely within the scanning range of the laser beam spot while the photomask 12 is waiting for a subsequent operation at a position whereat the alignment marks 15 and 15' are not irradiated with the laser beam spot. Next, the signals from the wafer 14 are synchronism-detected by the detectors 22 and 22'. The switch 33 is designed to conduct then therethrough the signals from the wafer.

The synchronism detection outputs for the right-hand and left-hand alignment marks 16 and 16' are fed back as error signals for servo-driving to control the deflectors 26 and 26' so that the center of vibration of the laser beam spot lies at the center of the alignment mark. The deflecting conditions of the four X and Y axes of the right and left deflectors are individually controlled. When the error of the alignment between the wafer and the center of vibration of the laser beam spot comes into an allowable range, the servo-drive for the deflectors is stopped and the switch 33 is changed over to detect the signal from the detector 23 which is associated with the photomask. Thus, the photomask 12 is moved to a position whereat the alignment marks 15 and 15' thereon are irradiated with the laser beam spot, whereupon the servomechanism 28 for moving the photomask 12 starts to operate. The error signals for driving the servomechansim are obtained by applying to the operational circuit 37 the synchronism-detection outputs which are the position $X_1$, $Y_1$ of the right-hand alignment mark of FIG. 2 and the position $X_2$, $Y_2$ of the left-hand alignment mark. When the photomask is to be aligned to a relative position $X_0$, $Y_0$ which is slightly displaced with respect to the wafer, the operator applies an offset $X_0$, $Y_0$ to the operational cricuit 37 by the use of a voltage generator 36. The error signals for driving the servomechanism, namely, the X and Y coordinates and the angle of rotation Ⓗ with the counter-clockwise direction as the normal direction are proportional is amount to the following:

$$X = \frac{X_1 + X_2}{2} - X_0 \tag{1}$$

$$Y = \frac{Y_1 + Y_2}{2} - Y_0 \tag{2}$$

$$Ⓗ = Y_1 - Y_2 \tag{3}$$

The spacing between the right-hand and left-hand alignment marks on the photomask and the spacing between the right-hand and left-hand alignment marks on the semiconductor wafer usually differ from each other because of the difference in coefficient of expansion or the like between the two materials. Even when the error amounts X, Y and Ⓗ are zero, $X_1$ and $X_2$ are not zero but the errors of $X_1$ and $X_2$ are equally divided for the right and the left. When the error amounts have come into a predetermined range, the servomechanism 28 is stopped from operating, thus terminating the alignment. Then, the printing of a microcircuit pattern onto the wafer is effected. In the present embodiment, whether the positions of the alignment marks on the wafer are within a predetermined range of accuracy or not may be reconfirmed by changing over the switch 33 when the alignment has been terminated.

Description will now be made of a second embodiment which is similar to the first embodiment in that the directions of the gratings of the alignment marks on the photomask and the semiconductor wafer are different and the diffracted lights from these gratings are separately detected by descrete detectors but which differs from the first embodiment in that the scannithe laser beam spot is effected linearly at uniform velocity and the signal processing is carried out by the use of a digital technique. As shown in FIGS. 5-a and 5-b, the directions of the gratings 51 and 53 of the alignment marks on the photomask and the semiconductor wafer are different, for example, orthogonal to each other. The alignment each formed by an aggregation of rectangles together constituting the grating are configured into a shape comprising two segments extending in different directions, for example, an angle bracket shape as shown in FIGS. 5-a or 5-b. The coordinates of the bend point in the angle bracket shape is considered to be the reference (center) position of each alignment mark. As shown in FIG. 5-c, suppose XY coordinates with the bend point of the alignment mark on the semiconductor wafer as the origin and let the angles formed by the two segments of the alignment mark with the X-axis be equal. If scanning is effected along the Y-axis in the direction of arrow 59, diffracted light will occur four times. The diffracted light from the alignment mark on the photomask is indicated by 54, 55a, 55b, 55c and so on, and the diffracted light from the alignment mark on the wafer is indicated by 56, 57a, 57b, 57c and so on. Since these diffracted lights emerge in different directions and can be separately detected by discrete detectors. The photoelectric outputs are illustrated in FIG. 5-d, wherein pulses 65 and 68 are the signals from the wafer and pulses 66 and 67 are the signals from the photomask. These signals are detected by discrete detectors. The time intervals between these four pulses are $t_1$, $t_2$ and $t_3$, of which $t_1$ is the time interval between the pulses from the alignment marks 50 and 52, and the sign of $t_1$ is positive when the first pulse is obtained by detecting the diffracted light from the alignment mark 50, but negative when the first pulse is obtained by detecting the diffracted light from the alignment mark 52. The sign of $t_3$ is positive when the third pulse is obtained by detecting the diffracted light from the alignment mark 52, but negative when the third pulse is obtained by detecting the diffracted light from the alignment mark 50.

If the scanning velocity of the laser beam spot is $v$ and if the two segments in the angle bracket shape from ±45° with the X-axis, the coordinates $X_1$, $Y_1$ for the bend point 60 in the alignment mark 52 on the photomask may be obtained from:

$$X_1 = v \cdot \frac{t_1 + t_3}{2} \tag{4}$$

$$Y_1 = v \cdot \frac{-t_1 + t_3}{2} \tag{5}$$

A feature of the present embodiment is that the signal from the photomask and the signal from the semiconductor wafer are already separated at the point of time whereat they have been photoelectrically converted and thus, the necessity of determining whether the signal is from the photomask or from the semiconductor wafer is eliminated in the course of signal processing, and this leads to the simplification of the signal processing system as compared with the method in which the signal from the photomask and the wafer are discriminated therebetween after photoelectrically converted.

By the principle described above, it is possible to obtain the positions $X_1$, $Y_1$ and $X_2$, $Y_2$ of the two alignment marks on the photomask with respect to the two right-hand and left-hand alignment marks on the wafer 14 in FIG. 2. Then the error amounts with respect to the target values for alignment can be known from equations (1), (2) and (3). Such error amounts, including the amount of offset $X_0$, $Y_0$, will be:

$$X = v \cdot \frac{t_1 + t_3 + t_4 + t_6}{4} - X_0 \quad (6)$$

$$Y = v \cdot \frac{-t_1 + t_3 + t_4 + t_6}{4} - Y_0 \quad (7)$$

$$\theta = v \cdot \frac{-t_1 + t_3 + t_4 + t_6}{2} \quad (8)$$

The apparatus of the second embodiment is generally similar to that shown in FIG. 2, with the exception that the XY deflector 26 and the servomechanism for controlling the same are not necessary and the scanning of the laser beam spot is effected only by the Y-scanner. The scanning takes place in such a manner that the spot periodically repeats its uniform linear motion. The Y-scanner may be the one mentioned in connection with the first embodiment. The mechanism for moving the photomask is identical to that in the first embodiment.

The second embodiment will be described more specifically. A circuit for waveform-shaping the signals detected by the detectors will first be explained with reference to FIG. 6. The signals detected by four detectors 22, 23, 22' and 23' are illustrated in FIG. 5-d. These signals are individually waveform-shaped in order that the peak point of the photoelectric pulse may be accurately taken out. As shown in FIG. 6-a, the waveform shaping circuit W1 serves to process the output from an amplifier A1 to convert it into a signal of TTL level and direct the same to a gate generator and gate. FIG. 6-b shows an example of the waveform shaping circuit and FIG. 6-c illustrates the time chart of operation. Input signal W101 is on the one hand made into a differential signal W102 by an RC differentiation circuit, and on the other hand compared with a level W103 by a comparator W11. The output of the comparator W11 is W104, and NR of this output and the output W105 of another comparator W12 is W106. The shaded portion W119 of signal W105 is indefinite in output. Signal W106 is transformed into a pulse of very narrow width by a monostable multivibrator W14. The width of such pulse is smaller than the period of the clock pulse which will later be described, and the rising portions W114 and W118 represent the peaks of the original photoelectric signal W101.

Figure 7:
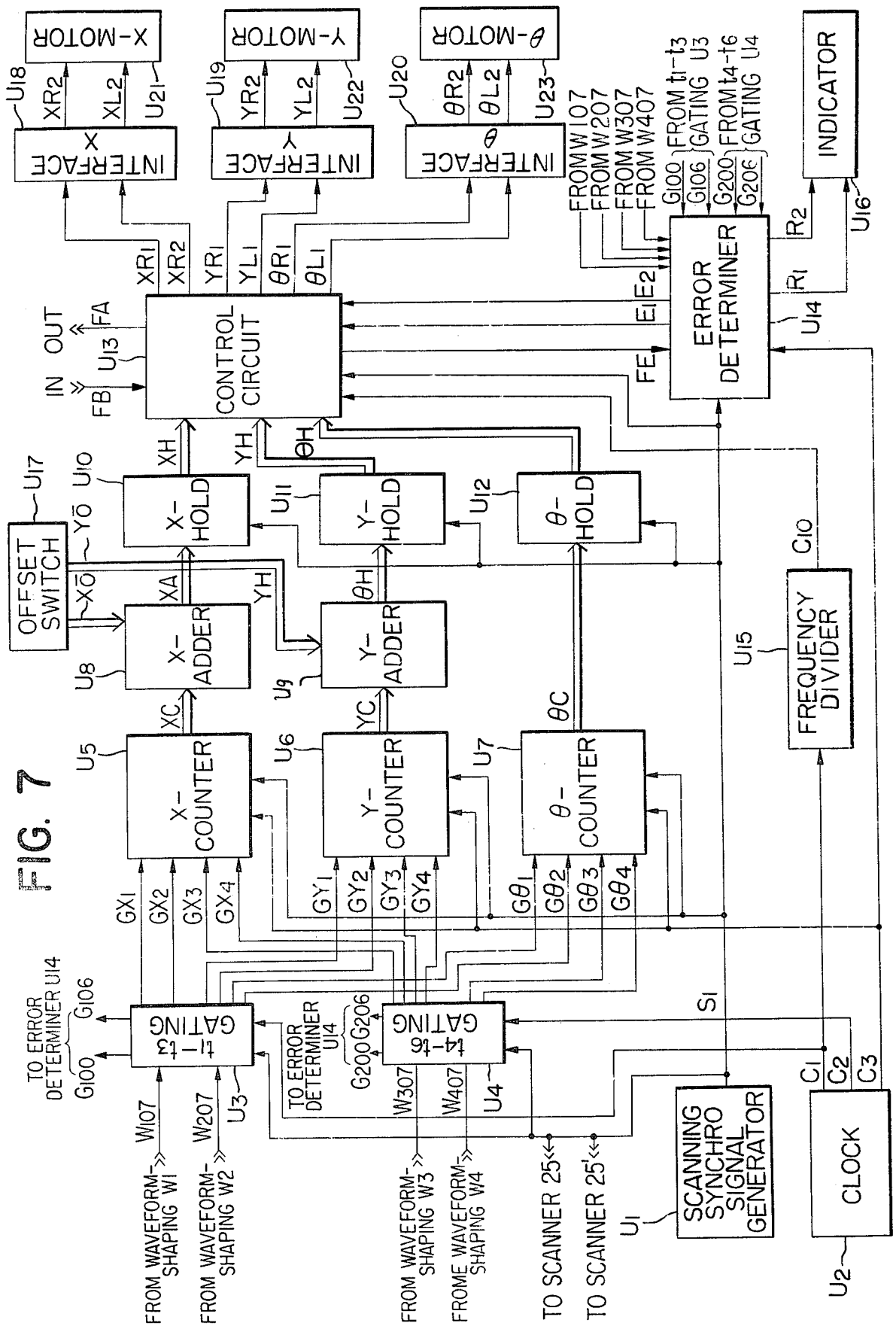
FIG. 7 is a block diagram of the signal processing system in the second embodiment.

The waveform-shaped signals for the four photoelectric signals 69, 70, 75 and 76 in FIG. 5-d are applied to $t_1 - t_3$ gating circuit U3 and $t_4 - t_6$ gating circuit U4 shown in the block diagram of FIG. 7. The signal from the right-hand alignment mark 50 on the wafer, the signal from the right-hand alignment mark 52 on the photomask, the signal from the left-hand alignment mark on the wafer and the signal from the left-hand alignment mark on the photomask are called W107, W207, W307 and W407, respectively.

The $t_1 - t_3$ gating circuit U3 serves to generate gates of time intervals $t_1$ and $t_3$ from the four pulses provided as a result of one stroke of scanning and control the passage of clock pulse C1. Also, in the manner as already noted, it determines the signs of $t_1$ and $t_3$ and applies different gates in accordance with the signs prefixed to $t_1$ and $t_3$ in equations (6), (7) and (8), thus imparting to X-counter U5, Y-counter U6 and $\theta$-counter U7 a signal ordering "count up the pulse number" and a signal ordering "count down the pulse number". Further, it puts out two signals G100 and G106 to error determiner U14 and thereby gives the information as to how many of the photoelectric pulses have been counted. This circuit forms an essential part of the present invention and will hereinafter be described in greater detail.

Figure 9:
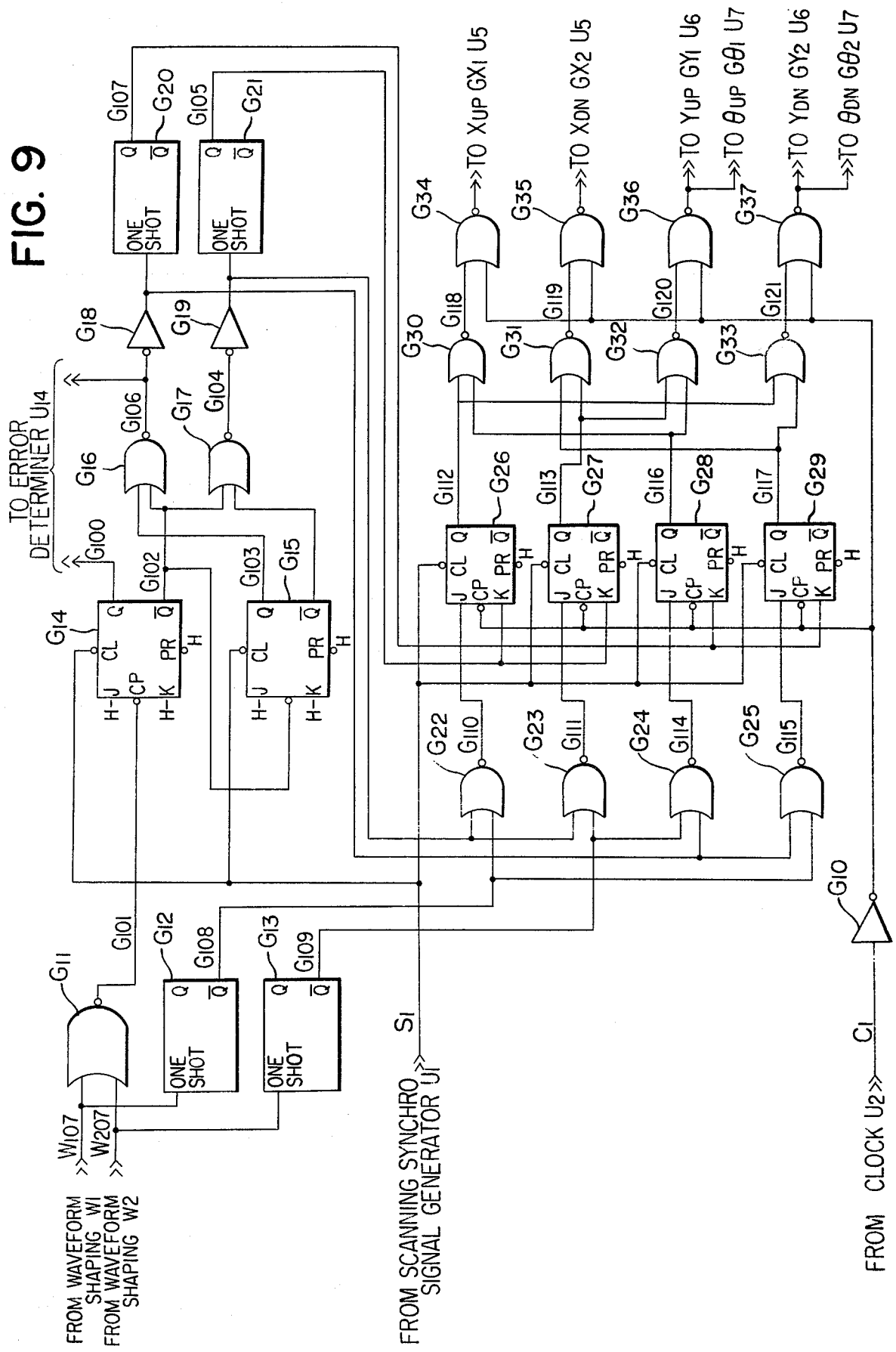
FIG. 9 diagrammatically illustrates the $t_1 - t_3$ gating circuit in the second embodiment.
Figure 10:
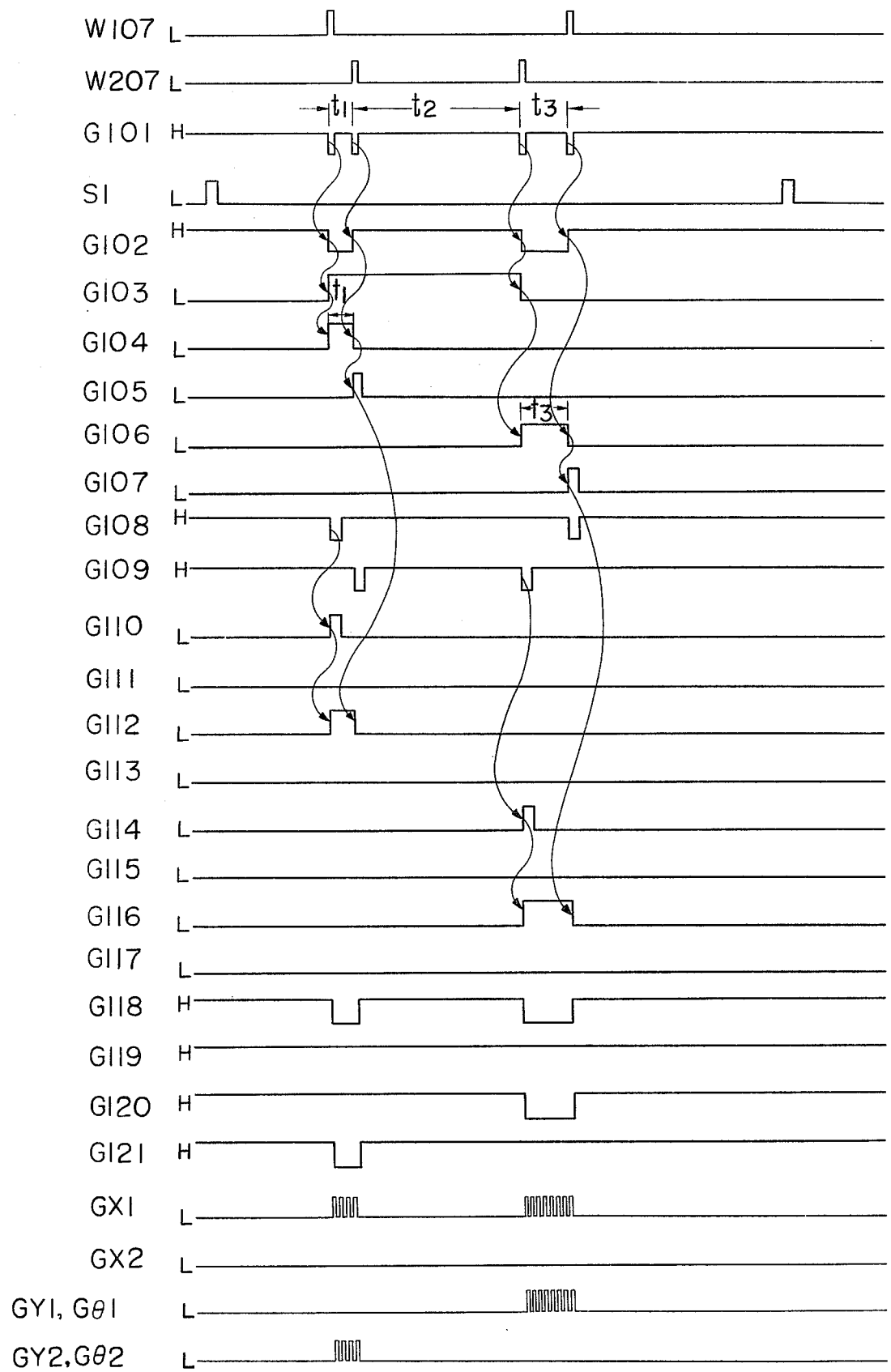
FIG. 10 is a time chart for the $t_1 - t_3$ gating circuit.

FIG. 9 diagrammatically shows the $t_1 - t_3$ gate generator and gate, and FIG. 10 shows the time chart thereof. The signals W107 and W207 in FIG. 10 are the signals obtained by the signals 69 and 70 of FIG. 5-d being waveform-shaped. NR of the signals W107 and W207 is G101. Also, signal S1 synchronous with the scanning of the light spot is being applied to the circuit and by the falling of such signal, the circuit is reset to its initial condition for each scanning. The pulse width of this signal is several times as great as the period of the clock pulse C1 which will later be described. G102 is a signal obtained by inverting the output of flip-flop G14 in FIG. 9 which varies its condition by the falling of the signal G101, and G103 is the output of flip-flop G15 in FIG. 9 which varies its condition by the falling of said signal G102. These flip-flops are cleared by the falling of the scanning synchronism signal S1. NR of the inverted signal (not shown) from the signal G103 and the signal G102 is G104 whose pulse width is $t_1$. NR of the signal G102 and the signal G103 is G106 whose pulse width is $t_3$. A monostable multivibrator G21 in FIG. 9 is operated by the falling of the signal 104 to provide a signal 105, and a monostable multivibrator G20 in FIG. 9 is operated by the falling of the signal G106 to provide a signal 107. By their rising, signal W107 from the wafer and signal W207 from the photomask operate multivibrators G12 and G13 in FIG. 9 and are transformed into pulses whose widths are longer than the period of the clock pulse C1. Their negative logic outputs are G108 and G109. Since G104 is at high level over the time interval $t_1$ between the first and the second pulse, pulse is put out to G110 which is NR of the negation of G104 and G108 as long as the first pulse is a signal from the wafer. Likewise, NR of the negation of G104 and G109 is G111 and pulse is put out to G111 as long as the first pulse is a signal from the photomask. Since G106 is at high level over the time interval $t_3$ between the third and the fourth pulse, pulse is put out to G114 which is NR of the negation of G106 and G109 as long as the third pulse is a signal from the photomask, and pulse is put out to G115 which is NR of the negation of G106 and G108 as long as the third pulse is a signal from the wafer. Flip-flop G26 in FIG. 9 assumes high level upon rising of G110 and assumes low level upon rising of G105 and thus, it maintains high level for the time $t_1$ as long as the first pulse is a signal from the wafer. Likewise, G113 maintains high level for the time $t_1$ as long as the first pulse is a signal from the photomask. G116 maintains high level for the time $t_3$ as long as the third pulse is a signal from the photomask, and G117 maintains high level for the time $t_3$ as long as the third pulse is a signal from the wafer. It should be noted that the signals subsequent to the signals G112, G113, G116 and G117 are in synchronism with the clock pulse C1. It should also be noted that the signals are put out in accordance with the signs determined for $t_1$ and $t_3$. More specifically, G112 maintains high level for $|t_1|$ when $t_1$ is positive, and G113 when $t_1$ is negative; and G116 maintains high level for $|t_3|$ when $t_3$ is positive, and G117 when $t_3$ is negative.

Gate signals are generated from the above-described signals in accordance with the signs prefixed to $t_1$ and $t_3$ in equations (6), (7) and (8). Since the signs before $t_1$ and $t_3$ in equation (6) for X are both positive, the gate signal G118 to the signal which counts up the pulse number is generated from NR of G112 and G116, and the gate signal G119 to the signal which counts down the pulse number is generated from NR of G113 and G117. Thus, if the clock pulse and these signals G118 and G119 are taken out, there may be obtained a pulse train GX1 to be counted up and a pulse train GX2 to be counted down. The pulses are not put out to GX1 and GX2 at a time. Likewise, in equation (7) for Y and equation (8) for $\theta$, the sign prefixed to $t_1$ and $t_3$ are negative and positive, respectively, G113 and G116 generate the gate signal which is to count up and G112 and G117 generate the gate signal which is to count down. In this manner, there may be obtained count-up pulse train GY1 and count-down pulse train GY2 to be applied to the Y-counter and count-up pulse train G$\theta$1 and count-down pulse train G$\theta$2 to be applied to the $\theta$-counter.

G100 and G106 obtained by inverting the signal 102 are used to check up the number of pulses applied during one period as will later be described.

The $t_4$-$t_6$ gating circuit U4 is entirely identical in circuit arrangement to the $t_1$-$t_3$ gating circuit U3. However, the gating circuit U4 differs from U3 in that the input signals to this gating circuit are detection signals for the left-hand alignment marks, namely, signal W307 from the wafer and signal W407 from the photomask; that C2 is applied as clock signal; and that as the outputs, GX3 and GX4 instead of GX1 and GX2 are respectively counted up and counted down by the X-counter and GY3 and GY4 instead of GY1 and GY2 are respectively counted up and counted down by the Y-counter but G$\theta$4 and G$\theta$3 correspond to G$\theta$1 and G$\theta$2, respectively, and G$\theta$4 is counted up while G$\theta$3 is counted down.

In FIG. 7, count-up pulse trains GX1 and GX3 and count-down pulse trains GX2 and GX4 are applied as input to X-counter U5. The X-counter U5 serves to count up the signal for R of GX1 and GX3 and count down the signal for R of GX2 and GX4, but it cannot accurately count, for example, when pulses appear at GX1 and GX3 at a time. To avoid this, as seen in FIG. 8, time division is effected by the use of clock pulses C1 and C2 which are half-period out of phase with each other. The signal GX1 from the $t_1$-$t_3$ gating circuit U3 is synchronized with the clock pulse C1 and the signal GX3 from the $t_4$-$t_6$ gating circuit U4 is synchronized with the clock pulse C2 so that GX5 which is R of these two signals accurately puts out the sum of the pulse numbers and if count is effected in synchronism with clock pulse C3, there may be obtained the sum of the pulse numbers of GX1 and GX3.

In this manner, the pulse put out by the $t_1$-$t_3$ gating circuit U3 of FIG. 7 is synchronized with the clock pulse C1 and the pulse put out by the $t_4$-$t_6$ gating circuit U4 is synchronized with the clock pulse C2, so that X-counter U5, Y-counter U6 and $\theta$-counter U7 which operate in synchronism with the clock pulse C3 count the pulse numbers exactly corresponding to the coordinates in accordance with equations (6), (7) and (8). The contents of these counters are cleared for each scanning by falling of the pulse of scanning synchronism signal S1.

It is an offset switch U17 that imparts an offset ($X_0, Y_0$) to the alignment intended, and the value set up by the operator are converted into binary numbers and entered into X-adder and Y-adder. The thick arrow in FIG. 7 indicate that data are transmitted in parallel. The outputs XA, YA and $\theta$C of X-adder U8, Y-adder U9 and $\theta$-counter are respectively held in X-hold U10, Y-hold U11 and $\theta$-hold U12 by the rising of the scanning synchronism signal S1. Thus, the data of the error amounts in X, Y and $\theta$ are stored upon rising of the scanning synchronism signal S1 and cleared upon falling of the signal S1. Such data are held as XH, YH and $\theta$H from the rising to the falling of the signal S1.

Control circuit U13 has various functions, of which the main function is to convert the error signals XH, YH and $\theta$H entered in parallel in the form of binary numbers into pulse trains of such frequencies that a series of pulse motors may respond thereto. The other functions of the control circuit U13 are to receive an alignment start signal FB from the outside and start alignment, to put out an end-of-alignment signal FA to the outside of the system when the alignment has come into a predetermined range of error, to apply a motor stop signal E1 and a position shift signal E2 from the error determiner to control the motors, and to put out a signal FE indicating that the alignment is going on.

When the alignment start signal FB entered from the outside assumes high level, automatic alignment is started by the rising of a subsequent scanning synchronism signal S1. When this occurs, the signal FE indicative of the alignment going on is rendered to high level while the end-of-alignment signal FA is rendered to low level. Scanners 25 and 25' are normally in operation to maintain steady state condition whether or not the alignment is being effected, and the other circuit blocks are also in operation, but no pulse is being sent to the motors — this is the inoperative condition of the automatic alignment apparatus.

The negative or the positive sign of the error signals XH, YH and $\theta$H is determined by whether the most significant bit is 1 or 0.

The pulse applied to the pulse motor is timed and put out by a pulse train C10 resulting from the clock pulse C1 being counted down by a frequency divider U15. The error signals XH, YH and $\theta$H applied to the control circuit U13 are newly rewritten by falling of the scanning synchronism signal S1 while, at the same time, they check up whether or not the measurement errors have come into the allowable range of error preset by the operator and if so, they stop putting out the pulse to the motors and render to low level the alignment-going-on signal FE with a time delay corresponding to one period of scanning while rendering the end-of-alignment signal FA to high level. The error signals XH, YH and $\theta$H are set by respective counters a little later than the falling of the scanning synchronism signal S1 and if the contents of the counters are of the positive sign, subtract 1 by 1 therefrom and put out pulses so as to rotate the motors in a direction to reduce the error amounts in accordance with the clock pulse C10, and when the contents of the counters become zero, stop putting out the pulses. If the contents of the counters are of the negative sign, the error signals put out pulses so as to rotate the motors in the opposite direction while, at the same time, they add 1 by 1 until the contents of the counters become zero, whereupon these signals stop putting out the pulses.

Pulses are applied from different lines to the pulse motors to rotate them in opposite direction to one another. For the X-motor, right-hand rotation signal XR1 and left-hand rotation signal XL1 are put out and are changed in pulse height and width by an interface U18, and then applied to the X-motor U21. This is also the case with both the Y-motor and the $\theta$-motor.

The error determiner U14 receives signals W107, W207, W307, W407 from the waveform-shaping circuits W1, W2, W3, W4, signals G100, G106 from the $t_1$-$t_3$ gate generator and gate U3 and signals G200, G206 from the $t_4$-$t_6$ gate generator and gate U4, and counts the pulse numbers and if the number of pulses from each of the right-hand and left-hand alignment marks is less than 4 for one stroke of scanning, puts out an appropriate instruction signal. First, when it has been continuously detected in four strokes of scanning that any one of the four detectors can put only one pulse, the error determiner renders the motor stop signal E1 and the error indication signal R1 to low level. When the motor stop signal is put out, the control circuit U13 stops putting out the pulse to the motors.

In other situations than the above, namely, when two pulses are provided from each of the four detectors and two of the four pulses from overlapped right-hand or left-hand marks have been put out just at a time, the gating circuit is not operative so that the error determiner puts out the position shift signal E2 which causes the control circuit U13 to shift the X-coordinates by an amount corresponding to four pulses.

Also, when the offset $X_0$, $Y_0$ is not imparted, signals from the sets of right-hand and left-hand detectors of detecting the right-hand and left-hand overlapped marks are entirely overlapped and if, as viewed in time sequence, it appears that only two pulses are being put out from each of the right-hand and the left-hand marks, the alignment has come to an end and thus, the error determiner U14 puts out the motor stop signal E1.

In a situation different from any of the above-described situations, the error determiner U14 generates a signal R2 in accordance with the alignment-going-on signal FE from the control circuit U13 to cause the indicator board to indicate that the alignment is going on. When the aforementioned, X, Y and $\theta$ error signals have come into the predetermined range of error, the control circuit U13 generates the end-of-alignment signal FA, thus terminating all controls.

Since it is usually the case that the spacing between the right-hand and the left-hand alignment mark on the photomask and the spacing between the right-hand and the left-hand alignment mark on the wafer are not strictly equal, the alignment in the X-coordinates is ultimately terminated at a location whereat the error amounts of the right-hand and left-hand alignment marks are averaged. If the spacings between the right-hand and left-hand alignment marks are equal, alignment is effected such that the alignment marks 50 and 52 on the photomask and the semiconductor wafer are overlapped with each other. Even if the two alignment marks are overlapped with each other, the signals from the two alignment marks can be separately detected due to the difference in direction of the diffracted lights, as in the first embodiment.

A third embodiment of the present invention will now be described. In this embodiment, the alignment marks on the photomask and the semiconductor wafer are respectively configured to form a bent line by a single line, as indicated by 77R, 77L in FIG. 11-a and 78R, 78L in FIG. 11-b, instead of being formed by a small grating as in the first or the second embodiment. In addition, the right-hand and left-hand marks are respectively line-symmetric about the center line on the photomask and the semiconductor wafer. The scanning by the laser beam spot is carried out in the form of uniform linear motion as in the second embodiment, that is, when the spot 79R lies on the alignment mark 77R on the photomask, the diffracted light 80R expands in a perpendicular direction to the line of that alignment mark, and when the spot 81R lies on the alignment 78R on the wafer, the diffracted lights 82 expands also in a perpendicular direction to the line of this alignment mark. However, since these two alignment marks differ in the direction of line, the diffracted lights emerge toward different areas even if the overlapping point of the alignment marks is scanned, and therefore the signals from the overlapped alignment marks can be separated from each other by the use of the partial mirrors 19 and 19' as shown in FIG. 2. Since the size of the laser beam spot is larger than the width of the line forming each alignment mark, there is no fear that the underlying one of the overlapped alignment marks should be shadowed by the overlying mark to prevent the diffracted light from being provided.

As shown in FIG. 11-c, with the alignment marks 77R', 77L' on the photomask overlapped with the alignment marks 78R', 78L' on the semiconductor wafer, scannings are effected by the laser beam spot in the directions of arrows 83R and 83L. These scannings take place with the same periodicity and in synchronism for the right-hand and the left-hand marks. Thus, photoelectric pulses as shown by 76, 77, 78 and 79 in FIG. 12 are provided from points 88R, 89R, 90R and 91R on the right-hand marks and photoelectric pulses as shown by 82, 83, 84 and 85 in FIG. 12 are provided from points 88L, 89L, 90L and 91L on the left-hand marks.

The present embodiment differs from the second embodiment in that the signals reaching one detector are not restricted to those from one of the alignment marks on either the mask or the wafer, but the two pulses detected by one detector are from different marks.

Now, assume that the pulse intervals are $t_1$, $t_2$, $t_3$ and $t_4$, $t_5$, $t_6$. The sign of $t_1$ is positive when the alignment mark 77R' on the photomask is scanned for the first time on the right-hand side, and negative when the alignment mark 78r' on the wafer is scanned for the first time on the right-hand side; and the sign of $t_3$ is positive when the alignment mark 78R' on the wafer is scanned for the third time on the right-hand side, and negative when the alignment mark 77R' on the photomask is scanned for the third time on the right-hand side. The sign of $t_2$ is always positive. Likewise, for the left-hand side scanning, the sign of $t_4$ is positive when the alignment mark 77L' on the photomask is scanned for the first time, and negative when the alignment mark 78L' on the wafer is scanned for the first time, and the sign of $t_6$ is positive when the alignment mark 78L' on the wafer is scanned for the third time, and negative when the alignment mark 77L' on the photomask is scanned for the third time. The sign of $t_5$ is always positive, Thus, as regards the right-hand alignment marks, the coordinates $X_1$, $Y_1$ for the bend point 85 in the mark 77R' on the photomask of FIG. 11-c will be:

$$X_1 = v \frac{|t_1| + 2t_2 + |t_3|}{2} \quad (9),$$

$$Y_1 = v \frac{t_1 - t_3}{2} \quad (10),$$

where $v$ is the scanning velocity of the spot with the bend point 74R in the wafer mark as the reference. Also, as regards the left-hand marks, the coordinates $X_2$, $Y_2$ for the bend point 85L in the photomask mark with the bend point 74L in the wafer mark as the origin will be:

$$X_2 = v \frac{-|t_4| - 2t_5 - |t_6|}{2} \quad (11),$$

$$Y_2 = v \frac{t_4 - t_6}{2} \quad (12).$$

By these, the total positional deviations X, Y in the alignment and the error $\theta$ in rotation are given:

$$X = v \frac{|t_1| + 2t_2 + |t_3| - |t_4| - 2t_5 - |t_6|}{4} - X_0 \quad (13),$$

$$Y = \frac{t_1 - t_3 + t_4 - t_6}{4} - Y_0 \quad (14),$$

$$\theta = v \frac{t_1 - t_3 - t_4 + t_6}{4} \quad (15),$$

where $v$ is the scanning velocity of the laser beam spot, and $X_0$, $Y_0$ are the amounts of offset when the alignment marks on the photomask and the wafer are aligned to the positions parallel-deviated by $X_0$ and $Y_0$. The requirement for the marks used in the present embodiment is simply that the right-hand and the left-hand mark on both the photomask and the wafer be strictly symmetrical, and the spacing between the right-hand and left-hand marks need not be strictly determined as was required in the first and second embodiments. This is because the present embodiment intends to attain a position whereat the alignment errors of the right-hand and left-hand alignment marks are balanced.

Figure 13:
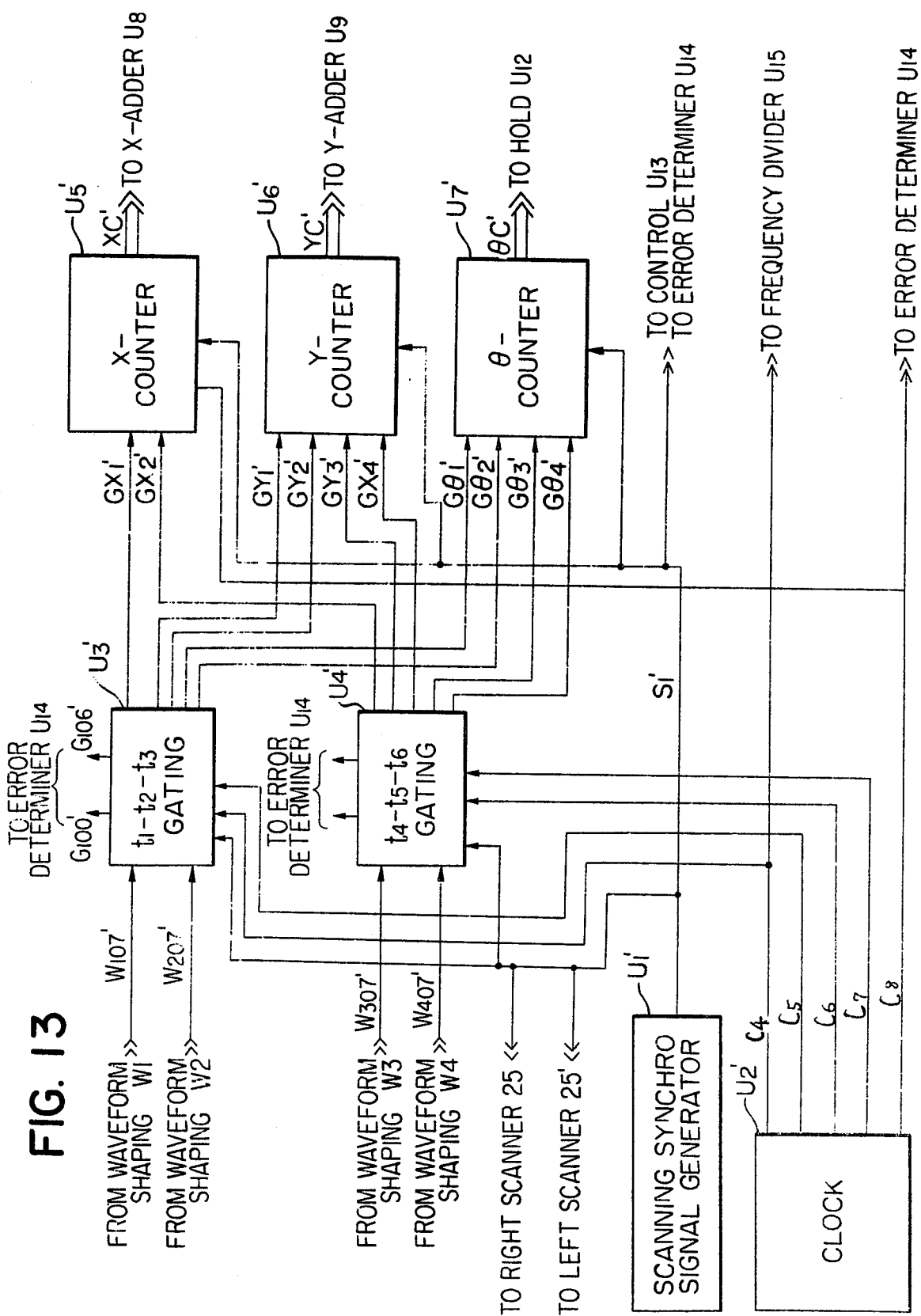
FIG. 13 is a block diagram of a portion of the signal processing system in the third embodiment.

FIG. 13 illustrates, in block diagram, part of the signal processing system in the present embodiment. The remainder of the system is similar to that in the second embodiment and need not be shown.

Differences of the present embodiment from the second embodiment will be seen by comparing equations (6), (7), (8) with equations (13), (14), (15). A great difference is that in equation (13) for the error amount X, the signs of $t_1$, $t_3$, $t_4$ and $t_6$ need not be taken into account. The difference in sign of the coefficients in the equations for Y and $\theta$ makes no essentially important difference, but may be solved by interchanging the count-up input and the count-down input for the Y-counter U6 and the $\theta$-counter U7.

Figure 15:
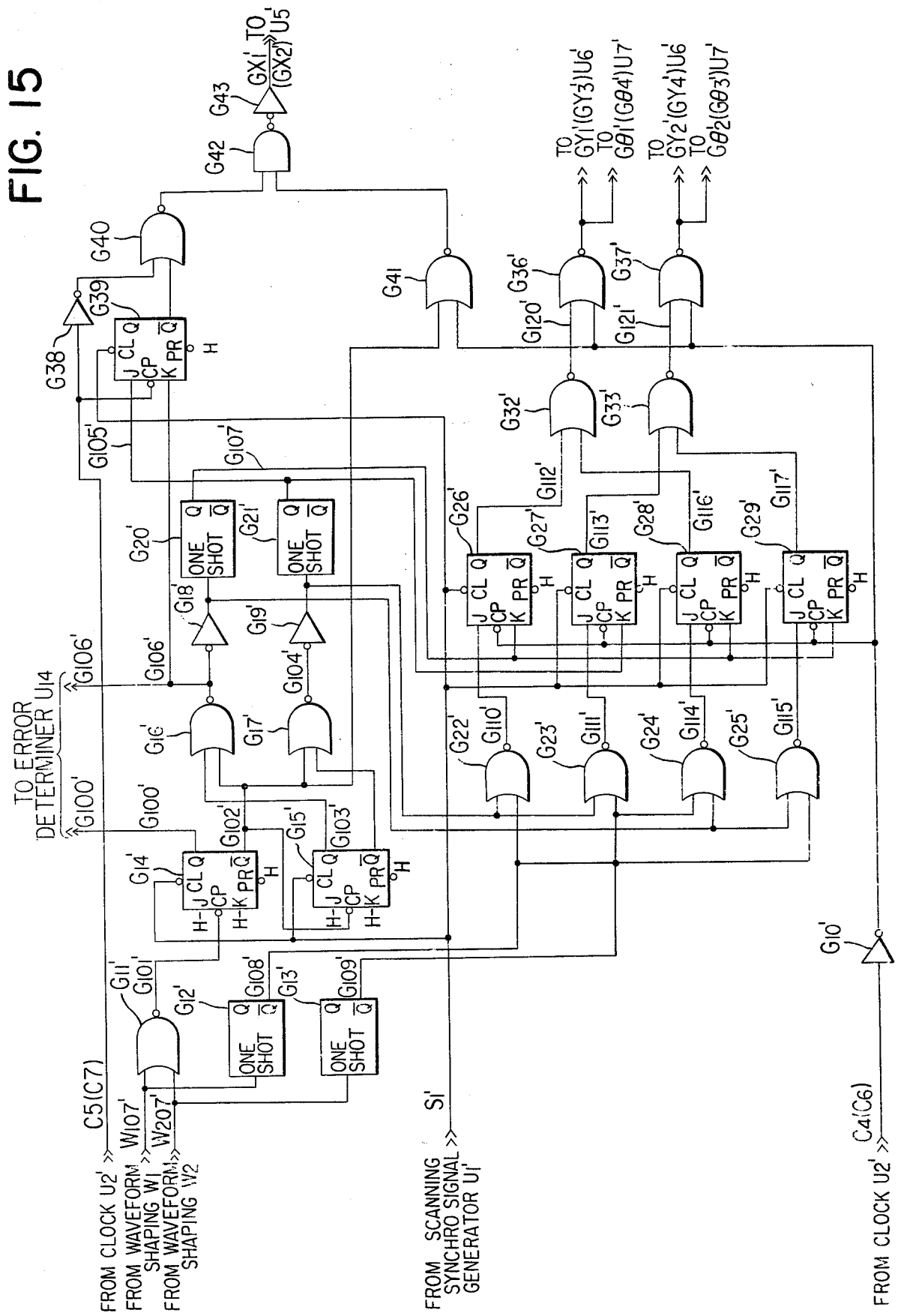
FIG. 15 is a diagram of the $t_1 - t_2 - t_3$ gating circuit in the third embodiment.

FIG. 15 is a circuit diagram of the $t_1 - t_2 - t_3$ gate generator and gate. For the count of X, the sign of $t_1$ and $t_3$ need not be taken into consideration and therefore, gates of time intervals $t_1$ and $t_3$ are generated by a signal G102' similar to the signal G102 of FIG. 10 and a gate of time interval $t_2$ is generated by the rising of signals G105' and G106' similar to the signals G105 and G106 of FIG. 10. Since equation (13) shows that the coefficient of $t_2$ is twice the coefficient of $|t_1|$, $|t_3|$, a clock pulse of frequency double that of clock pulse C4 must be passed during the gating of $t_2$. For this reason, as shown in FIG. 14, use is made of clock pulse C4 and clock pulse C5 putting out pulses at mid-points between two adjacent pulses of clock pulse C4. The clock pulse C4 is passed during the gating of $t_1$ and $t_3$ and the clock pulse C5 is passed during the gating of $t_2$. Therefore, the pulse train counted up by the X-counter is as indicated by GX1', which shows that the frequency of the output pulse during $t_2$ is double that during $t_1$ or $t_3$. Signal GY1' counted up by the Y-counter U6', signal GY2' counted down by the Y-counter U6', signal G$\theta$1' counted up by the $\theta$-counter U7' and signal G$\theta$2' counted down by the $\theta$-counter U7' are gated and put out in accordance with equations (14) and (15).

In the $t_4 - t_5 - t_6$ gate generator and gate U4', clock pulses C6 and C7 are used instead of clock pulses C4 and C5. In FIG. 14, the clock pulse C6 is delayed a quarter of one period with respect to the clock pulse C5, and the clock pulse C7 is delayed half a period with respect to the clock pulse C5. The pulse train GX2' applied from the $t_4 - t_5 - t_6$ gate generator and gate U4' to the X-counter is counted down. Clock pulse C6 is put out during the gating of $t_4$ and $t_6$, and clock pulse C7 is put out during the gating of $t_5$. The pulse of GX2' is put out when the pulse of GX1' is not being put out and so, if GX1' and GX2' are counted up and counted down, respectively, by a counter synchronized with clock pulse C8, the error amount in the X-coordinates may be obtained accurately. Likewise, for the Y-counter U6' and the $\theta$-counter U7', the signals from the $t_1 - t_2 - t_3$ gate and the signals from the $t_4 - t_5 - t_6$ gate can be detected in a time-division fashion.

The signal processing system of the third embodiment is entirely similar to the second embodiment, only with the exceptions of the clock U2', the two gate generators and gates U3', U4' and the X-counter U5' seen in FIG. 13.

In the second and third embodiments, the moving distance of the light spot on the semiconductor wafer and on the photomask surface is 2 mm and the scanning frequency is 25 Hz. The frequency of the clock pulse C1, C2, C4, C6 is 1 MHz and scanning of 2 mm is effected for about 40 msec. and thus, one period 1 $\mu$sec. of the clock pulse corresponds to about 0.05 $\mu$m. The accuracy of alignment is determined by an accuracy determiner in the control circuit which determines whether or not the alignment error has come into the allowable range, and such allowable error is selected to one of 0.1 $\mu$m, 0.2 $\mu$m, 0.5 $\mu$m and 1.0 $\mu$m by the operator through a switch. Alignment between the semiconductor wafer and the photomask is automatically effected if the errors in both X- and Y-direction are within $\pm 0.2$mm with respect to the reference point of the light spot scanning before the automatic alignment is entered.

According to the present invention constructed as described above, for example, in a semiconductor production machine, optical signals from alignment patterns on a semiconductor wafer and optical signals from alignment patterns on a photomask may be entirely separately detected even if those alignment patterns on the wafer and photomask are overlapped with each other during alignment of the wafer and photomask, and this enables a high degree of positioning to be achieved without affecting the accuracy of the alignment even when the composite optical image has an error with respect to the alignment between the semiconductor wafer and the photomask as was experienced in the prior art.

We claim:

1. An alignment apparatus for photoelectrically detecting X- and Y-direction position signals of a wafer and a mask each having thereon right-hand and left-hand reference marks and for aligning the wafer and the mask in a predetermined positional relationship by the use of said signals, comprising:
   reference marks formed at the right-hand and left-hand sides of each of said wafer and said mask, each of said reference marks comprising two mark elements extending in two different directions, said reference marks being formed such that when said mask and wafer are overlapped with each other, diffracted lights in different directions are produced from adjacent ones of said mark elements on said mask and wafer;

a first source of coherent light for illuminating the right-hand marks on said mask and wafer with a coherent spot light;

a second source of coherent light for illuminating the left-hand marks on said mask and wafer with a coherent spot light;

first scanning means for scanning the right-hand marks on said mask and wafer by said spot light so that diffracted lights are produced from said mark elements of said wafer and mask in one stroke of scanning; and second scanning means for scanning the left-hand marks on said mask and wafer by said spot light so that diffracted lights are produced from said mark elements of said wafer and mask in one stroke of scanning;

first, second, third and fourth detector means for respectively detecting the diffracted lights in one direction and the diffracted lights in the other direction produced from the right-hand marks on said wafer and mask and the diffracted lights in one direction and the diffracted lights in the other direction produced from the left-hand marks on said wafer and mask, and for photoelectrically converting said diffracted lights respectively;

whereby wafer position signals and mask position signals for the alignment of said wafer and mask may be separately produced by said first, second, thrid and fourth detector means.

2. An alignment apparatus according to claim 1, wherein said right-hand and left-hand marks on said wafer are cross-shaped marks each comprising a group of gratings arrayed in the same direction, and said right-hand and left-hamd marks on said mask are cross-shaped marks each comprising a group of gratings arrayed in the same direction which is different from the direction of the gratings of the marks on said wafer.

3. An alignment apparatus according to claim 2, wherein said first scanning means scans the right-hand marks on said wafer and mask in X- and Y-direction at different frequencies at a time, and said second scanning means scans the left-hand marks on said wafer and mask in X- and Y-direction at different frequencies at a time, the scanning by said first scanning means being in synchronism with the scanning by said second scanning means.

4. An alignment apparatus according to claim 2, wherein the direction of the gratings of said wafer marks is 90° out of phase with the direction of the gratings of said mask marks.

5. An alignment apparatus according to claim 1, wherein the right-hand mark on said wafer is a V-shaped mark comprising a group of gratings arrayed in the same direction and formed symmetrically about the X-axis passing through the vertex of the V, the left-hand mark on said wafer is a V-shaped mark identical to said right-hand mark but formed symmetrically about the X-axis passing through the vertex thereof or an axis parallel to said X-axis, the right-hand mark on said mask is a V-shaped mark comprising a group of gratings arrayed in the same direction and formed symmetrically about the X'-axis passing through the vertex of the V, the left-hand mark on said mask is a V-shaped mark formed symmetrically about the X'-axis passing through the vertex thereof or an axis parallel to said X'-axis, the marks on said wafer and the marks on said mask are oriented in the same direction but the direction of said mask mark gratings differs from the direction of said wafer mark gratings.

6. An alignment apparatus according to claim 5, wherein said first scanning means effects uniform linear scanning with a predetermined periodicity in such a direction that said spot light once passes over each arm of said wafer mark and said mask mark in one stroke of scanning, and said second scanning means effects uniform linear scanning with a predetermined periodicity in such a direction that said spot light once passes over each arm of said wafer mark and said mask mark in one stroke of scanning, the scanning by said first scanning means being in synchronism with the scanning by said second scanning means.

7. An alignment appratus according to claim 5, wherein the direction of said wafer mark gratings is 90° out of phase with the direction of said mask mark gratings.

8. An alignment apparatus according to claim 5, wherein each of the V-shaped marks on said wafer and mask has an angle of opening of 90°.

9. An alignment apparatus according to claim 1, wherein the right-hand and left-hand reference marks on said wafer are V-shaped reference marks comprising two segments symmetrical about the center line on said wafer and symmetrical about the X-axis passing through the vertices of the two V+s, and the right-hand and left-hand reference marks on said mask are V-shaped reference marks comprising two segments symmetrical about the center line on said mask and symmetrical about the X'-axis passing through the vertices of the two V+s, the right-hand and left-hand marks on said mask are opposite in direction to the right-hand and left-hand marks on said wafer.

10. An alignment apparatus according to claim 9, wherein said first scanning means effects uniform linear scanning with a predetermined periodicity in such a direction that said spot light once passes over each segment of said wafer mark and said mask mark in one stroke of scanning, and said second scanning means effects uniform linear scanning with a predetermined periodicity in such a direction that said spot light once passes over each arm of said wafer mark and said mask mark in one stroke of scanning, the scanning by said first scanning means being in synchronism with the scanning by said second scanning means.

11. An alignment apparatus according to claim 9, wherein each of the V-shaped marks on said wafer and mask has an angle of opening of 90°.

* * * * *

UNITED STATES PATENT AND TRADEMARK OFFICE
CERTIFICATE OF CORRECTION

PATENT NO. : 4,103,998
DATED : August 1, 1978
INVENTOR(S) : KIWAO NAKAZAWA, ET AL It is certified that error appears in the above-identified patent and that said Letters Patent are hereby corrected as shown below:

Column 1, line 45, delete "water" and insert --wafer--.

Column 7, line 63, delete "scannithe" and insert --scanning by the--.

Column 14, line 39, delete "78r'" and insert --78R'--.

Column 18, line 38, delete "V + s" and insert --V's--;
line 43, delete "V + s" and insert --V's--.

Signed and Sealed this

Nineteenth Day of June 1979

[SEAL]

Attest:

RUTH C. MASON
Attesting Officer

DONALD W. BANNER
Commissioner of Patents and Trademarks